United States Patent
Kurs et al.

(10) Patent No.: US 10,263,465 B2
(45) Date of Patent: Apr. 16, 2019

(54) RADIATIVE WIRELESS POWER TRANSMISSION

(71) Applicant: WiTricity Corporation, Watertown, MA (US)

(72) Inventors: Andre B. Kurs, Chestnut Hill, MA (US); Marin Soljacic, Belmont, MA (US); Arunanshu Mohan Roy, San Francisco, CA (US); Damiano Patron, Brighton, MA (US); Erika Ye, Saratoga, CA (US)

(73) Assignee: WiTricity Corporation, Watertown, MA (US)

( * ) Notice: Subject to any disclaimer, the term of this patent is extended or adjusted under 35 U.S.C. 154(b) by 294 days.

(21) Appl. No.: 15/375,880

(22) Filed: Dec. 12, 2016

(65) Prior Publication Data

US 2017/0179764 A1    Jun. 22, 2017

Related U.S. Application Data

(60) Provisional application No. 62/268,773, filed on Dec. 17, 2015.

(51) Int. Cl.
*H02J 50/00* (2016.01)
*H02J 50/23* (2016.01)
(Continued)

(52) U.S. Cl.
CPC .............. *H02J 50/00* (2016.02); *H01P 3/16* (2013.01); *H01P 5/087* (2013.01); *H01P 5/16* (2013.01);
(Continued)

(58) Field of Classification Search
CPC ..... H03H 7/38; H01P 5/16; H01P 5/08; H01P 3/16; H01P 5/087; H01Q 21/00
See application file for complete search history.

(56) References Cited

U.S. PATENT DOCUMENTS 3,729,740 A * 4/1973 Nakahara ............. H01Q 13/203
                                                           333/237
8,115,448 B2   2/2012 John
(Continued)

FOREIGN PATENT DOCUMENTS

| JP | 58-151705 | 9/1983 |
| JP | 2003-318648 | 11/2003 |
| JP | 2003318648 | * 11/2003 |

OTHER PUBLICATIONS

Yan, et al.; "Simulation and Experiment on SIW Slot Array Antennas;" IEEE Microwave and Wireless Components Letters; vol. 14; No. 9; Sep. 2004; pp. 445-448; 3 pages.
(Continued)

*Primary Examiner* — Jared Fureman
*Assistant Examiner* — Emmanuel Dominique
(74) *Attorney, Agent, or Firm* — Daly, Crowley, Mofford & Durkee LLP

(57) ABSTRACT

A wireless power transmission system (100) includes a conductive waveguide (110) at least partially filled with a dielectric material (115), the waveguide extending along a first direction (e.g., z-axis) from a first end (111a) to an opposing end (111b) thereof, the waveguide having a bottom face (112), a top face (114) and a pair of side faces (116a, 116b) that together form a substantially rectangular cross-section of the waveguide, the top face having a plurality of slots (118) oriented substantially orthogonal to the first direction and distributed between the first end and the opposing end, the slots separated from each other by a first distance ($l_1$) measured along the first direction. In one illustrative embodiment, the waveguide includes a plurality of barriers (120) interleaved with the plurality of slots, the barriers separated from each other by the first distance, each of the barriers extending between the top and bottom faces and having a barrier cross-section with an area smaller than (Continued)

an area of the waveguide cross-section and an input port (130) coupled with the first end of the waveguide, the input port configured to receive an input waveform (101) to be guided by the waveguide.

20 Claims, 8 Drawing Sheets

(51) Int. Cl.
| | |
|---|---|
| *H01P 3/16* | (2006.01) |
| *H01P 5/08* | (2006.01) |
| *H03H 7/38* | (2006.01) |
| *H01P 5/16* | (2006.01) |
| *H01Q 21/00* | (2006.01) |
| *H01Q 3/22* | (2006.01) |

(52) U.S. Cl.
CPC ......... *H01Q 21/0043* (2013.01); *H02J 50/23* (2016.02); *H03H 7/38* (2013.01); *H01Q 3/22* (2013.01); *H01Q 21/005* (2013.01)

(56) References Cited

U.S. PATENT DOCUMENTS

| | | |
|---|---|---|
| 8,159,364 B2 | 4/2012 | Zeine |
| 8,410,953 B2 | 4/2013 | Zeine |
| 8,446,248 B2 | 5/2013 | Zeine |
| 8,558,661 B2 | 10/2013 | Zeine |
| 8,854,176 B2 | 10/2014 | Zeine |
| 8,860,532 B2 | 10/2014 | Gong et al. |
| 9,095,729 B2 | 8/2015 | John |
| 9,124,125 B2 | 9/2015 | Leabman et al. |
| 9,142,973 B2 | 9/2015 | Zeine |
| 9,252,628 B2 | 2/2016 | Leabman et al. |
| 9,318,898 B2 | 4/2016 | John |
| 9,450,449 B1 | 9/2016 | Leabman et al. |
| 9,853,501 B2 * | 12/2017 | Hattori .................. H04B 13/00 |
| 2007/0178945 A1 | 8/2007 | Cook et al. |
| 2013/0109317 A1 * | 5/2013 | Kikuchi .................. H04B 7/24 |
| | | 455/41.2 |
| 2013/0162490 A1 | 6/2013 | Blech |
| 2013/0229240 A1 * | 9/2013 | Terada .................. H01Q 13/22 |
| | | 333/137 |
| 2014/0008993 A1 | 1/2014 | Leabman |
| 2014/0009108 A1 | 1/2014 | Leabman |
| 2014/0217967 A1 | 8/2014 | Zeine et al. |
| 2014/0241231 A1 | 8/2014 | Zeine |
| 2015/0042526 A1 | 2/2015 | Zeine |
| 2015/0207542 A1 | 7/2015 | Zeine |
| 2016/0331981 A1 | 11/2016 | John |

OTHER PUBLICATIONS

PCT International Search Report of the ISA for PCT Appl. No. PCT/US2016/066889; Mar. 15, 2017; 6 pages.

PCT Written Opinion of the ISA for PCT Appl. No. PCT/US2016/066889; Mar. 15, 2017; 12 pages.

Transmittal of International Preliminary Report on Patentability dated Jun. 28, 2018 for Int'l Appl. No. PCT/US2016/066889; 11 pages.

* cited by examiner

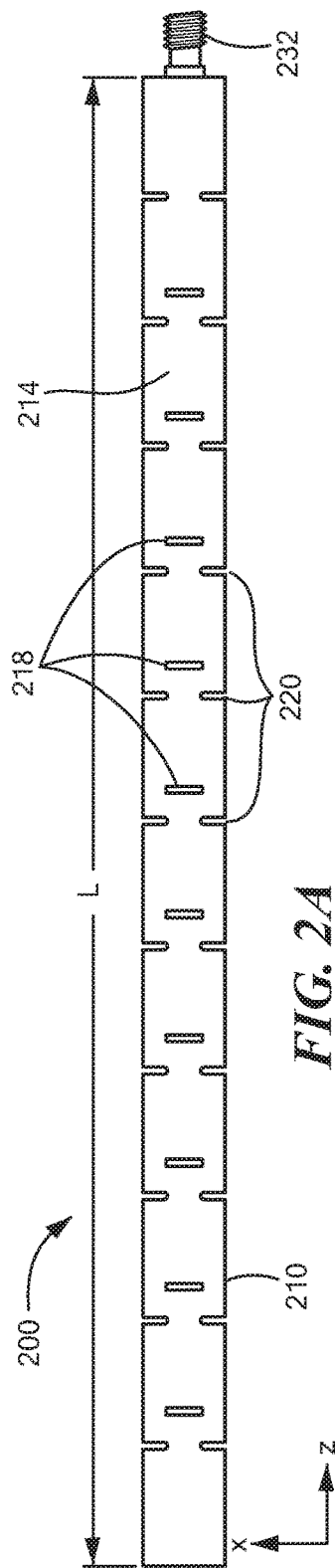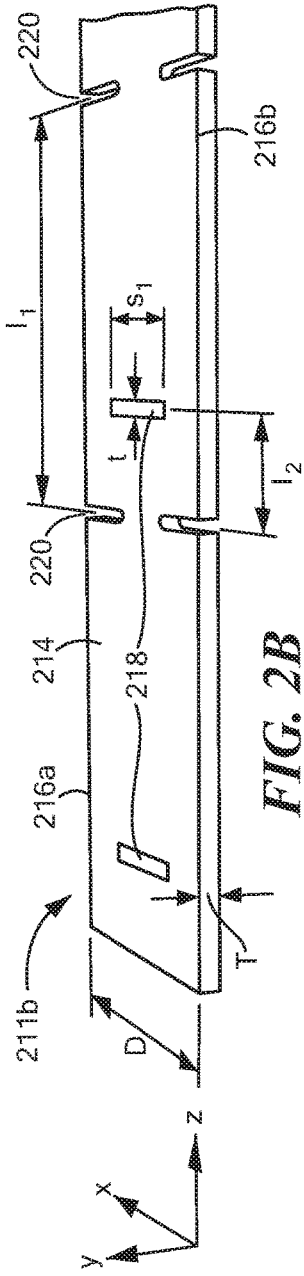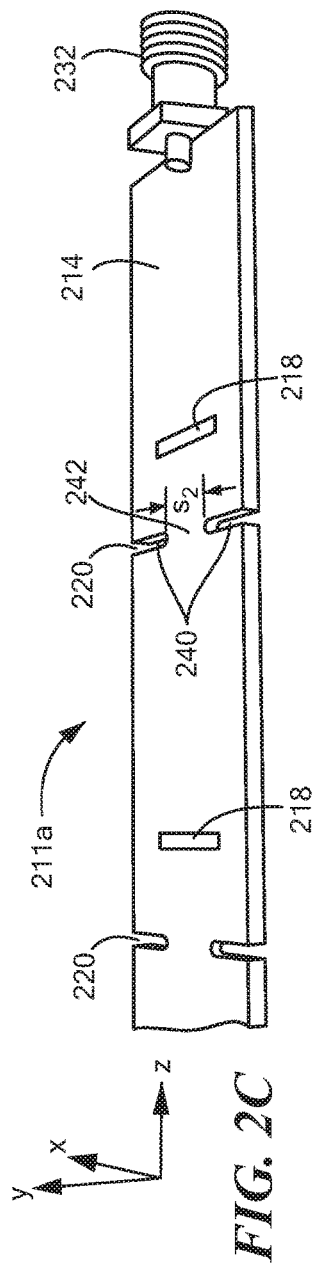

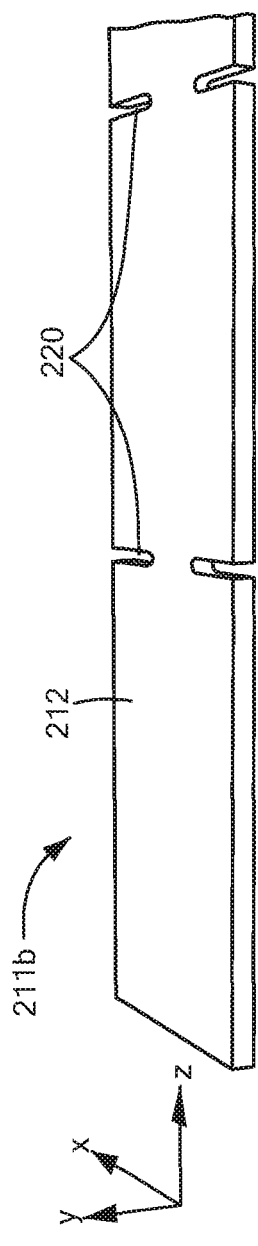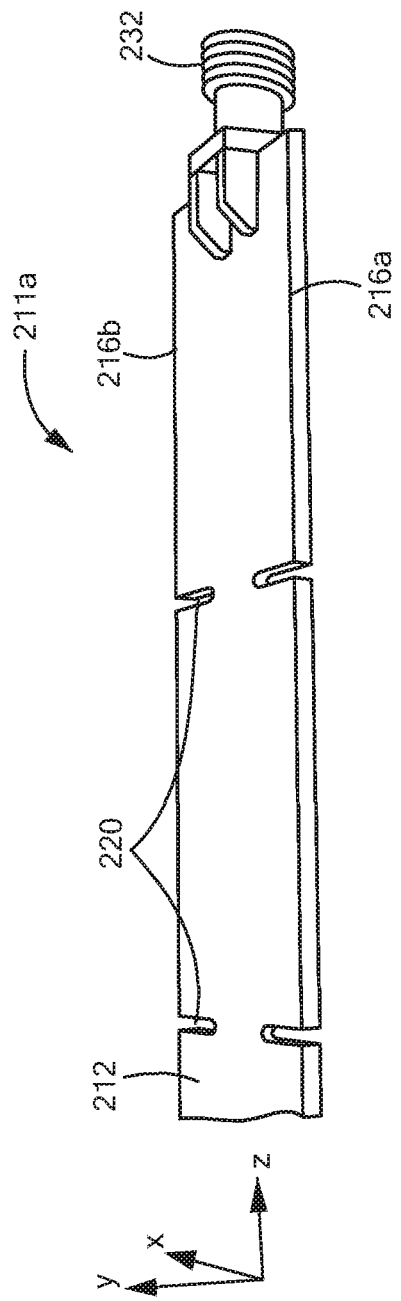

RADIATIVE WIRELESS POWER TRANSMISSION

CROSS REFERENCE TO RELATED APPLICATIONS

This application claims the benefit of U.S. Provisional Application No. 62/268,773 filed on Dec. 17, 2015 under 35 U.S.C. § 119(e) which application is hereby incorporated herein by reference in its entirety.

TECHNICAL FIELD

This disclosure relates to the field of wireless power transmission.

BACKGROUND

As is known in the art, wireless power transmission refers to the transmission of electrical energy from a source to a load without the use of physical (e.g. mechanical) signal paths or connectors between the source and load. In some wireless transfer systems, an antenna radiates radio waves from the source to a load.

SUMMARY

Disclosed herein are concepts, systems and methods for wireless power transmission via radiative or far-field techniques.

In a first aspect, the concepts, systems and methods described herein related to wireless power transmission systems can include a conductive waveguide at least partially filled with a dielectric material, the waveguide extending along a first direction (e.g., z-axis) from a first end to an opposing end thereof, the waveguide having a bottom face, a top face and a pair of side faces that together form a substantially rectangular cross-section of the waveguide, the top face having a plurality of slots oriented substantially orthogonal to the first direction and distributed between the first end and the opposing end, the slots separated from each other by a first distance ($l_1$) measured along the first direction. The waveguide can include a plurality of barriers interleaved with the plurality of slots, the barriers separated from each other by the first distance, each of the barriers extending between the top and bottom faces and having a barrier cross-section with an area smaller than an area of the waveguide cross-section. The system can also include an input port coupled with the first end of the waveguide, the input port configured to receive an input waveform to be guided by the waveguide.

Embodiments of the wireless power transmission systems can include any one or more of the following features.

Each of the side faces can include a plurality of conductive vias distributed from the first end to the opposing end, and each of the barriers can include two conductive vias spaced apart from each other by a second distance ($s_2$) measured orthogonal to the first direction, and from an adjacent slot by a third distance ($l_2$) measured along the first direction.

Each of the side faces can include a conductive plate extending from the first end to the opposing end, and each of the barriers can include two conductive plates arranged orthogonally to the respective side faces and separated from each other by a second distance ($s_2$) and from an adjacent slot by a third distance ($l_2$).

The waveguide cross-section can be configured to cause the waveguide to guide, from the first end to the opposing end, the input waveform having a frequency ($f_1$) in a target frequency range (e.g., 5.8±0.075 GHz), and a combination of the first distance ($l_1$), the second distance ($s_2$) and the third distance ($l_2$) can be configured to cause an output wave having the frequency of the input waveform to exit the waveguide through the plurality of slots along a propagation direction that forms a first angle ($90-\alpha_1$), relative the first direction, associated with the frequency of the input waveform.

The conductive waveguide can include a metal or a conductive polymer. The dielectric material can include low electrical loss material. The dielectric material can include ceramic, glass, polytetrafluoroethylene, polycarbonate or acrylic.

The input port (130) can include a coaxial cable connector. The input port can further include impedance matching circuitry.

The system can include a waveform source coupled with the input port to provide the input waveform to the input port.

The system can include a plurality of waveguides arranged along the first direction (e.g., the z-axis), and separated from each other by a predetermined separation ($\delta$) measured orthogonal to the first direction, and a plurality of input ports coupled with the first end of each of the respective waveguides, each of the input ports configured to receive a respective input waveform ($f_1, \varphi_i$) to be guided by the associated waveguide.

The input waveforms ($f1, \varphi_i$) applied at the input ports can have the same frequency ($f_1$) and corresponding phases ($\varphi_i$, where i=1 . . . $N_2$), and a combination of the phases and the predetermined separation between the waveguides can be configured to cause the output wave ($f_1$) to exit the waveguides through the slots along a propagation direction that has a first component that forms the first angle ($90-\alpha_1$) with the first direction (e.g., in the y-z plane) and a second component that forms a second angle ($\beta_1$) relative to a direction orthogonal to the first direction (e.g., in the x-y plane).

In another aspect, the disclosure features methods for wireless power transmission (see FIG. 1A) including receiving, at an antenna, a first input waveform having a first frequency ($f_1$), wherein the antenna comprises a first 1D-array of resonance cavities that (i) are coupled with their adjacent cavities through partially transmissive barriers, and (ii) have respective slots arranged orthogonally to a first direction that is parallel to the first 1-D array of resonance cavities, wherein the first input waveform is received at a first input port coupled to a first resonance cavity of the first 1D-array of resonance cavities, guiding the first input waveform through the first 1D-array of coupled resonance cavities, radiating a first output wave having the first frequency of the first input waveform through the slots along a propagation direction that forms a first angle ($90-\alpha_1$), relative the first direction, the first angle being associated with the first frequency of the first input waveform.

Embodiments of the methods can include any one or more of the following features.

The methods for wireless power transmission can include receiving, at the first input port a second input waveform having a second frequency ($f_2$) different from the first frequency ($f_1$), guiding the second input waveform through the first 1D-array of coupled resonance cavities, radiating a second output wave having the second frequency of the second input waveform through the slots along another propagation direction that forms a second angle $(90-\alpha_2)$, relative the first direction, the second angle being different from the first angle $(\alpha_1)$ and associated with the second frequency of the second input waveform.

The methods can include receiving, at a plurality of input ports that includes the first input port, first input waveforms $f_i, \varphi_i$) having corresponding phases $(\varphi_i)$, wherein the input ports are coupled with respective 1D-arrays of coupled resonance cavities that include the first 1D-array of coupled resonance cavities, the 1D-arrays of coupled resonance cavities being parallel to each other and separated from each other by a predetermined separation ($\delta$), guiding the first input waveforms through the respective 1D-arrays of coupled resonance cavities, and radiating the first output wave through the slots along another propagation direction that has a first component that forms the first angle $(90-\alpha_1)$ relative the first direction (e.g., in the y-z plane), and a second component that forms another angle $(\beta_1)$ relative to a direction orthogonal to the first direction (e.g., in the x-y plane).

In accordance with a further aspect of the concepts, systems and techniques sought to be protected herein, it has been recognized that many currently explored schemes for radiative wireless power transfer use either 2.4 GHz or 5.8 GHz frequencies. In order to transfer power over substantial distances with an acceptably low divergence angle (so that the efficiency would not be unacceptably low), the sources (transmitters) have to be fairly large. The divergence angle scales as $D/\lambda$, where D is the linear size of the source, and $\lambda$ is the wavelength of the wave used to transmit the power. The size of the source scales as $D^2$, so the penalty for using low wavelength is quite steep. For a frequency of 5.8 GHz, the wavelength $\lambda$ is about 5 cm.

In contrast, schemes which propose to rely on ultra-sound for wireless power transfer, can have (for a given divergence angle) much smaller sources, simply because their wavelength is much smaller. For example, if $f_{SOUND}=60$ kHz, this corresponds to $\lambda_{SOUND} \sim 0.5$ cm, or 10× smaller than the electromagnetic (EM) wave scheme which uses f=5.8 GHz. So, the transmitters used by ultrasound schemes could in principle be 100× smaller (in area) due to the smaller wavelength. However, the technology for converting energy into ultrasound (and back) is much less mature compared to the EM counterparts.

It has thus been recognized that the concepts system and techniques described herein may be used at higher frequencies (e.g. frequencies of about 30 GHz or about 60 GHz, or even higher). At 60 GHz, an EM wavelength will be about 0.5 cm, so one may capture many of the theoretical benefits of ultrasound (small wavelength). However, the technology to convert energy into EM waves at 30-60 GHz (and back) is much more mature. One reference on state-of-the-art of such conversion may be found at: http://repository.kulib.kyoto-u.ac.jp/dspace/bitstream/2433/179775/1/elex.10.20132009.pdf

BRIEF DESCRIPTION OF THE PROPOSED DRAWINGS

FIG. 2A is a top plan view of a waveguide antenna for wireless power transmission.

FIG. 2B is a top perspective view of an end portion of the waveguide antenna of FIG. 2A.

FIG. 2C is a top perspective view of an end portion of the waveguide antenna of FIG. 2A.

FIG. 2D is a bottom perspective view of the end portion of the waveguide antenna shown in FIG. 2B.

FIG. 2E is a bottom perspective view of the end portion of the waveguide antenna shown in FIG. 2C.

DETAILED DESCRIPTION

Disclosed are concepts, systems and methods in the field of beam steering antennas for radiative energy transfer. In illustrative embodiments, the antenna can be a coupled-cavity waveguide (CCW) having a series of unit cell resonators that are weakly coupled to each other. Depending on how strongly the resonator unit cells are coupled, the range of frequencies (the bandwidth) that can propagate through the waveguide can vary. Each of these frequencies can radiate an electromagnetic beam at different angles, allowing the antenna to steer the beams. In embodiments, the antenna can generate wide beam steering within a small frequency bandwidth, for example, of approximately 5.8±0.075 GHz. In embodiments, this antenna configuration can provide for a low-cost method of steering as compared to a traditional phased antenna array that may require phase-shifting components in addition to the frequency source.

Figure 1A:
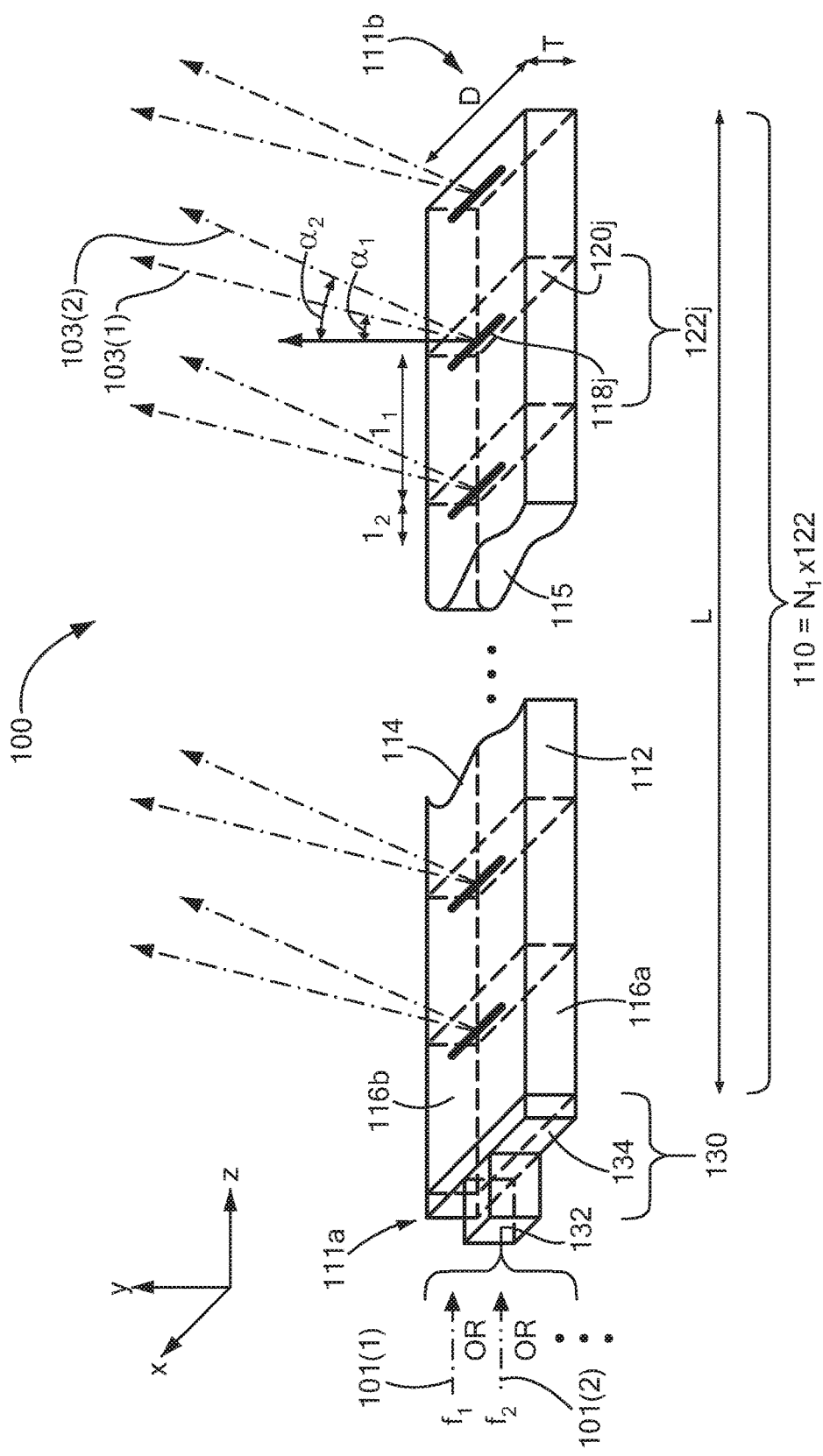
FIG. 1A is a schematic diagram of an antenna for wireless power transmission.

Referring now to FIG. 1A, an antenna 100 for wireless power transmission includes a conductive waveguide 110 having a dielectric material 115 disposed therein. In embodiments, the waveguide may be uniformly filled with the dielectric material, for example, Taconic RF-35TC, made primarily of a ceramic filled material reinforced with glass fabric (PTFE). In other embodiments, the waveguide may be partially filled with a dielectric. In still other embodiments, the waveguide may be air filled.

The waveguide may be provided, for example, from an electrically conductive material such as a metal, such as copper, or a conductive polymer. The waveguide has a bottom face (or walls or surface) 112, a top face (or walls or surface) 114, and a pair of side faces (or walls or surfaces) 116a, 116b, which together form a waveguide having a rectangular cross-section. In embodiments, the waveguide can have rounded edges (e.g. rounding which may occur during the course of a normal manufacturing process. The waveguide 110 has a length L, a width D and a thickness (or height) T. The top face 114 has a plurality of slots here $N_1$ slots 118a-118$N_1$, generally denoted 118 oriented along the x-axis (i.e. substantially transversely disposed relative to the direction of signal propagation in the waveguide). In this illustrative embodiment, slots 118 are distributed from a first end 111a of the waveguide 110 to an opposing end 111b thereof (along the z-axis), and separated from each other by a distance $l_1$ (measured along the z-axis). It should be appreciated that the slots are preferably tilted with respect to the transverse direction, but the spacing between them should preferably be substantially constant.

The waveguide 110 has a plurality of partially transmissive barriers 120 that are spaced from each other by the distance $l_1$. It should be appreciated that the barriers are meant to reduce the cross-sectional area of each resonant cavity. In this manner, the barriers 120 form a plurality of resonant cavities 122, each resonant cavity 122(j) coupled to its adjacent resonant cavities 122(j−1) and 122(j+1).

Each barrier 120 is separated from an adjacent slot 118 by a distance $l_2$. In this manner, the $N_1$ barriers 120 are interleaved with the $N_1$ slots 118, or equivalently, each of the coupled resonant cavities 122 has an associated slot 118. The antenna 100 also includes an input port 130 coupled with the first end 111a of the waveguide 110. The input port 130 includes a coaxial cable connector 132. The input port 130 may optionally include impedance matching circuitry 134. In embodiments, the impedance matching circuitry 143 can include a tunable element such as a tunable capacitor. It should, of course, be appreciated that elements having capacitive or inductive characteristics (e.g. capacitors and/or inductors) can be used as tunable elements. The tunable element can vary (or tune) the operating frequency. The inclusion of a tunable element can thus allow for the use of a single frequency source instead of a variable frequency source.

In embodiments, changing the material (i.e. changing the manner in which the waveguide is loaded or changing properties of the material with which the waveguide is loaded can cause the need to scale the waveguide. The wavelength of the input waveform depends at least in part, upon on the dielectric constant of the substrate (in this case, the dielectric material) used in the waveguide:

$$\lambda_0 = \frac{c}{f} \quad \text{(Eq. 1)}$$

$$\lambda_{substrate} = \frac{\lambda_0}{\sqrt{\varepsilon_r}} \quad \text{(Eq. 2)}$$

where Eq. 1 describes the wavelength $\lambda_0$ in free space (defined by speed of light c in free space) and the frequency of the input waveform and where Eq. 2 describes the wavelength $\lambda_{substrate}$ in a substrate (defined by a relative dielectric constant or relative permittivity $\varepsilon_r$). The wavelength of the waveform in the substrate used can be used to determine the dimensions of the waveguide. The greater the relative permittivity $\varepsilon_r$, the shorter the wavelength in the substrate $\lambda_{substrate}$ and the smaller the dimensions of the waveguide.

For example, the input port 130 receives a first input waveform 101(1) having a first frequency $f_1$. The input waveform can be a voltage or current sinusoidal waveform with frequency of 5.8±0.075 GHz. The waveguide 110 guides the first input waveform 101(1) from the input end 111a to the opposing end 111b thereof (e.g., along the z-axis). In this manner, the antenna 100 or emits a first radiated wave 103(1)—having the first frequency $f_1$ of the first input waveform 101(1) through the slots 118 of the waveguide 110. A first direction of propagation of the first radiated wave 103(1) is tilted by a first angle (90−$\alpha_1$), relative to the z-axis (in the y-z plane), that corresponds to the first frequency $f_1$.

As another example, the input port 130 receives a second input waveform 101(2) having a second frequency $f_2$. The waveguide 110 guides the second input waveform 101(2) from the input end 111a to the opposing end 111b thereof. In this manner, a second radiated wave 103(2) having the second frequency $f_2$ of the second input waveform 101(2) is output through the slots 118 of the waveguide 110. A second direction of propagation of the second wave 103(2) is tilted by a second angle (90−$\alpha_2$), relative to the z-axis (in the y-z plane), that corresponds to the second frequency $f_2$.

Figure 1B:
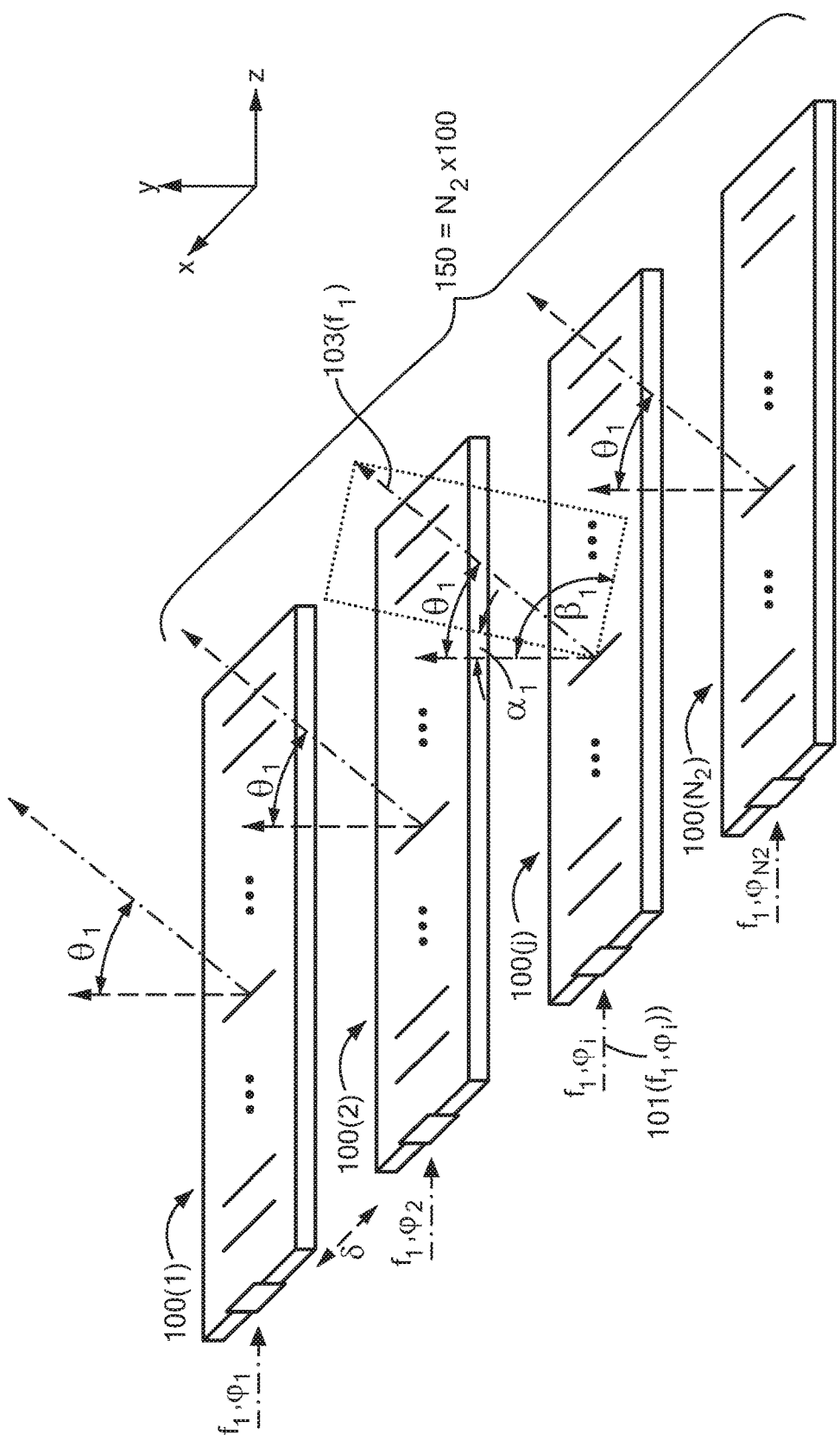
FIG. 1B is a schematic diagram of an antenna system for wireless power transmission.

Referring now to FIG. 1B, an antenna system 150 for wireless power transmission includes a plurality, here $N_2$, antennas 100(1)-100($N_2$). The waveguides 110 of the $N_2$ antennas 100(1)-100($N_2$) of the antenna system 150 are parallel to each other (e.g., in the same x-z plane) and separated from each other by a distance δ. It should be appreciated that in this illustrative embodiment, the waveguide is provided by cascading identical elements on the x-z plane, along the z-direction. The input ports 130 of the $N_2$ antennas 100 receive respective instances of the first input waveform 101($f_1$,$\varphi_i$) having the first frequency $f_1$ and phase $\varphi_i$, where i=1 ... $N_2$. The waveguides 110 of the $N_2$ antennas 100 guide the respective instances of the first input waveform 101($f_1$,$\varphi_i$) from the input end 111a to the opposing end 111b thereof (e.g., along the z-axis). In this manner, a first radiated wave 103($f_1$) having the first frequency $f_1$ of the first input waveform is output through the slots 118 of the $N_2$ waveguides 110, however, in this example, a first direction of propagation of the first radiated wave 103($f_1$) is tilted by the first angle (90−$\alpha_1$), relative to the z-axis (in the y-z plane), that corresponds to the first frequency $f_1$, and by another angle ($\beta_1$), relative to the y-axis (in the x-y plane), that corresponds to the phases $\varphi_1, \varphi_2, \ldots, \varphi_{N2}$.

Referring now to FIGS. 2A-2E in which like elements are provided having like reference designations throughout the several views, an antenna 200 for wireless power transmission, includes a waveguide 210 having input port 232. FIG. 2B is a top perspective view of opposing end 211b of the waveguide 210 and FIG. 2C is a top perspective view of first end 211a of the waveguide 210. FIG. 2D is a bottom perspective view of opposing end 211b of the waveguide 210 and FIG. 2E is a bottom perspective view of first end 211a of the waveguide 210.

The waveguide 210 has a bottom face 212 and a top face 214 (e.g., both parallel to the x-z plane), and side faces 216a, 216b (e.g., both parallel to the y-z plane). In this example, the side faces 216a, 216b are conductive walls or plates. The waveguide 210 has a length L (e.g., L=310.8 mm for $N_1$=12), width D (e.g., D=15.82 mm), and thickness T (e.g., T=0.762 mm). The top face 214 has slots 218 separated from each other by a distance $l_1$ (e.g., $l_1$=25.9 mm), each slot having a length $s_1$ (e.g., $s_1$=7.9 mm) and a thickness t (e.g., t=1 mm). The slots allow energy to be radiated in the form of electromagnetic waves.

Note that the bottom face 212 has no slots.

The waveguide 210 has partially transmissive barriers 220. Here, each barrier 220 is formed from two plates 240, arranged (e.g., in the x-y plane) orthogonally to respective side faces 216a, 216b, that are separated from each other by a distance $s_2$ (e.g., $s_2$=6.37 mm). Alternatively, each barrier 220 may be provided from a single plate 240, arranged (e.g., in the x-y plane) orthogonally to respective faces 216a, 216b, that has an aperture 242 of width $s_2$.

In one illustrative embodiment, the plate(s) 240 may be formed by plating cuts (that are, e.g., 4.7 mm long along the x-axis and 0.5 mm wide) in the dielectric material enclosed inside the conducting waveguide 210. A barrier 220 is separated from an adjacent slot 218 by a distance $l_2=0.28*l_1$. The conductive barriers may also be provided from plated through holes or provided in the substrate or one or more from conductive posts disposed in the waveguide (e.g. through a dielectric in a partially or fully dielectric loaded waveguide.)

Figure 3A:
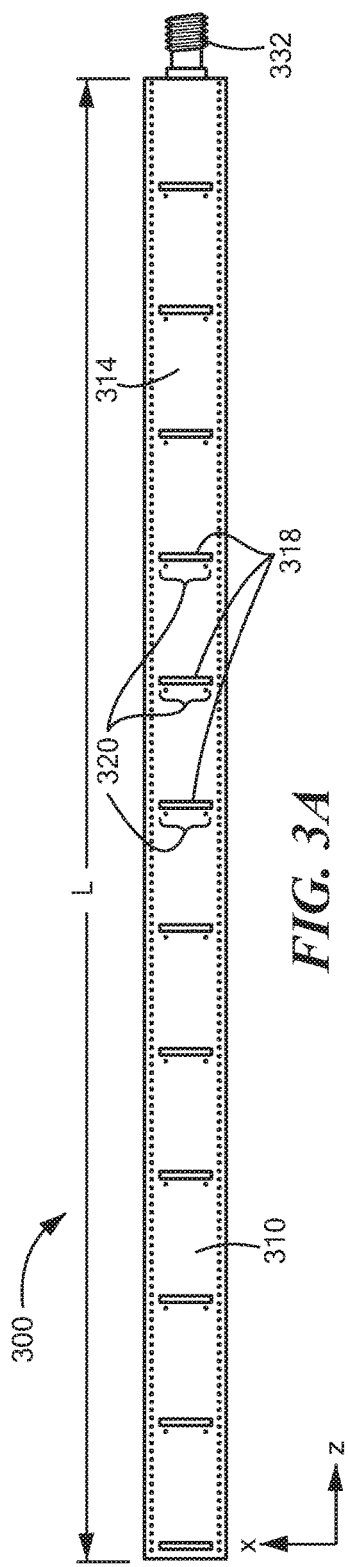
FIG. 3A is a top plan view of an antenna for wireless power transmission.
Figure 3B:
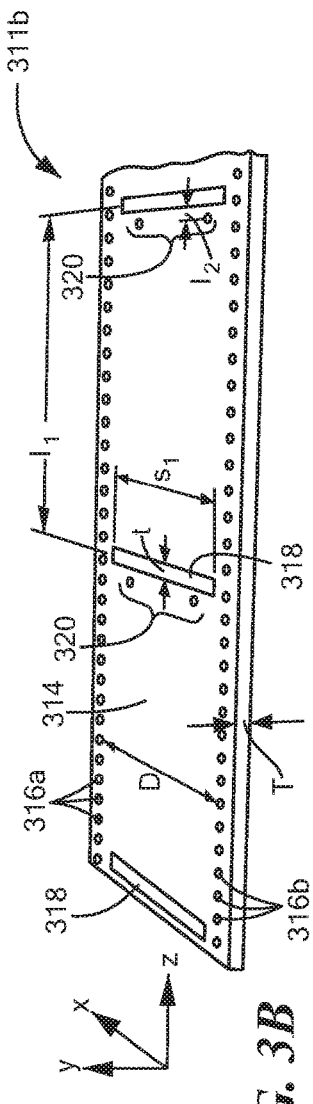
FIG. 3B is a top perspective view of an end portion of the waveguide antenna of FIG. 3A.
Figure 3C:
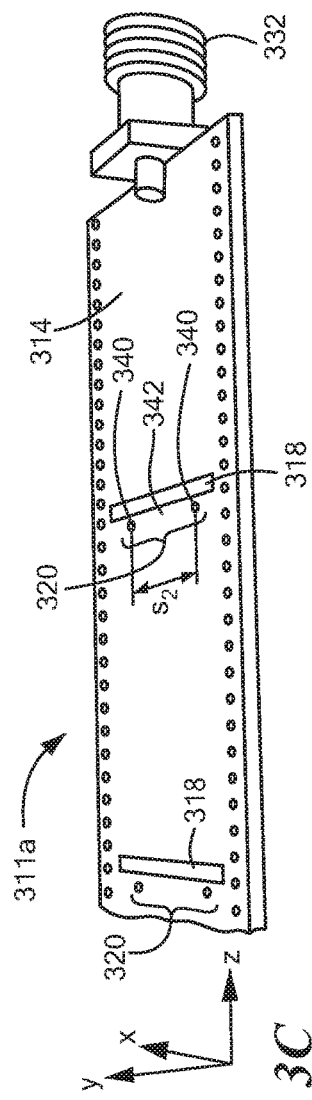
FIG. 3C is a top perspective view of an end portion of the waveguide antenna of FIG. 3A.
Figure 3D:
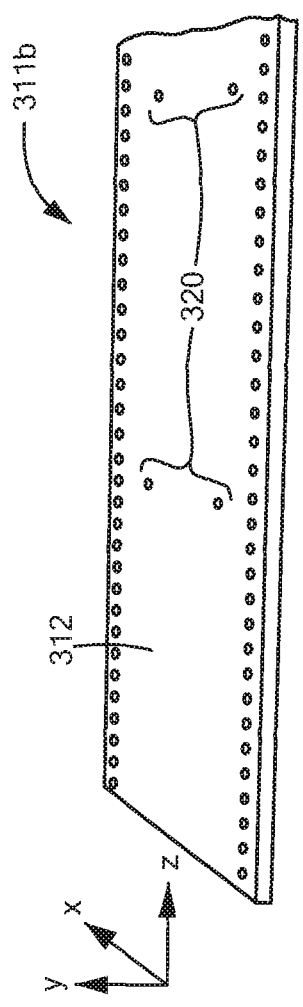
FIG. 3D is a bottom perspective view of the end portion of the waveguide antenna of FIG. 3B.
Figure 3E:
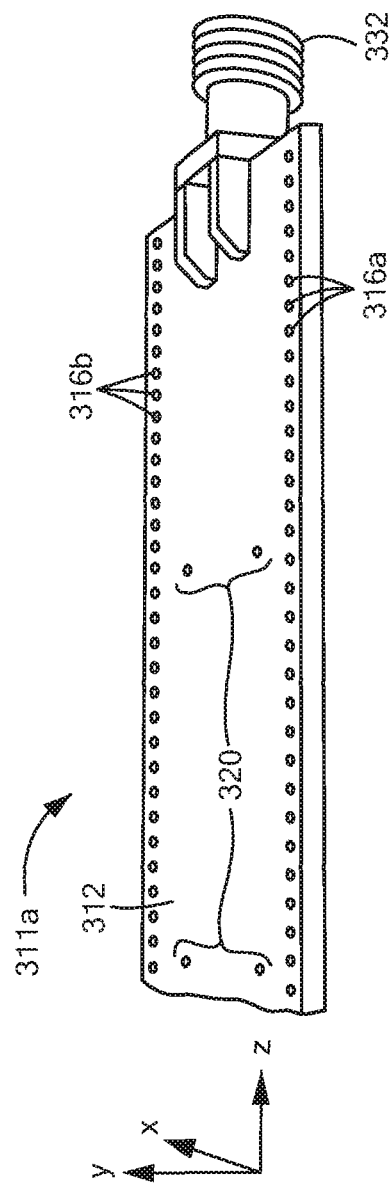
FIG. 3E is a bottom perspective view of the end portion of the waveguide antenna of FIG. 3C.

Referring now to FIG. 3A, an antenna 300 for wireless power transmission, includes a waveguide 310 having input port 332. FIG. 3B is a top perspective view of opposing end 311b of the waveguide 310 and FIG. 3C is a top perspective of first end 311a of the waveguide 310. FIG. 3D is a bottom perspective view of opposing end 311b of the waveguide 310 and FIG. 3E is a bottom perspective view of first end 311a of the waveguide 310. The waveguide 310 has a bottom face 312 and a top face 314 (e.g., both parallel to the x-z plane), and side faces (e.g., both parallel to the y-z plane). In this example, the first side face is a 1D-array of conductive vias 316a, and the second side face is a 1D-array of conductive vias 316b. Here, the vias of each of these 1D-arrays have a diameter of about 0.5 mm and are separated from each other by 1.8 mm. The waveguide 310 has a length L (e.g., L=310.8 mm for $N_1$=12), width D (e.g., D=17.9 mm measured between 1D-array of conductive vias 316a and 1D-array of conductive vias 316b) and thickness T (e.g., T=0.762 mm). The top face 314 has slots 318 separated from each other by a distance $l_1$ (e.g., $l_1$=26.8 mm), each slot having a length $s_1$ (e.g., $s_1$=11.8 mm) and a thickness t (e.g., t=0.9 mm). Note that the bottom face 312 has no slots. The waveguide 310 has partially transmissive barriers 320. Here, each barrier 320 is formed from two conductive vias 340 having a diameter of about 0.5 mm that are separated from each other by a distance $s_2$ (e.g., $s_2$=7.15 mm). Equivalently, each barrier 320 has an effective aperture 342 of width $s_2$ formed by the two conductive vias 340. A barrier 320 is separated from an adjacent slot 318 by a distance $l_2=0.03*l_1$. In embodiments, the cross-section of this waveguide can be trapezoidal. For example, the bottom face 312 can be larger than the top face 314 of the waveguide 310 shown in FIG. 3A-3B.

In exemplary embodiments, a wireless power transmission system can include an additional input port coupled to the opposing end 111b of the waveguide 110. This additional input port can be configured to receive a second input waveform to be guided by the waveguide 110 from the opposing end 111b to the first end 111a. In embodiments, the second input waveform can have a different frequency than the first input waveform received at the input port coupled with the first end 111a.

Figure 4A:
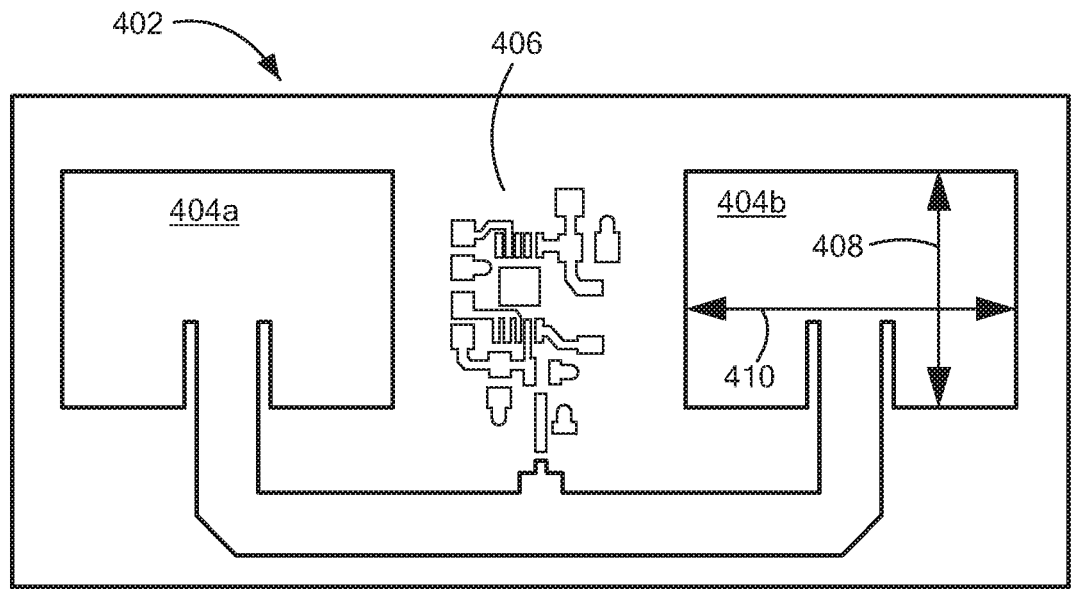
FIG. 4A is a top plan view of an antenna for wireless power reception.

Referring now to FIG. 4A, a wireless power receiver in printed circuit form includes an array, here two, linearly polarized antennas 404a and 404b coupled through an RF transmission line to the receiver electronics 406 including an AC-to-DC converter and voltage stabilization circuitry, such as voltage multipliers, buck and/or boost regulators. In embodiments, the converter 406 converts the received oscillating electromagnetic energy (from the antennas 404a and 404b) to direct current for the use of a load or battery. The load or battery can be that of a mobile device or other electronic device.

In this illustrative embodiment, each of the antennas 404a, 404b are approximately 11.5 mm 408 by 15.5 mm 410 in dimension.

Figure 4B:
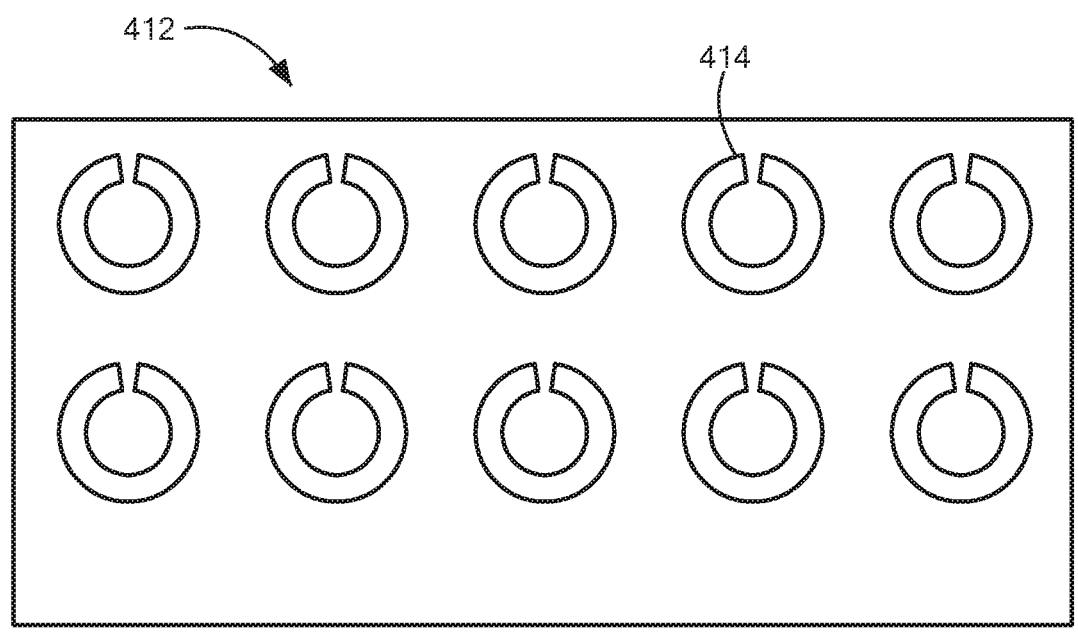
FIG. 4B is a top plan view of a frequency selective surface for a wireless power receiver.

Referring now to FIG. 4B, a frequency selective surface (FSS) 412 for a wireless power receiver is provided from a metamaterial that can include unit cells of conductor traces 414 with approximate size of 6.5 mm outer diameter and 4 mm inner diameter with a top-center cut with width of 0.9 mm. As defined herein, a unit cell is the description of each slotted ring, which creates the periodic structure. The number of the unit cells are chosen to cover the area of the antennas 404a and 404b. The size of the unit cells are chosen based on the range of operating frequency. The traces of the unit cells are shaped in a broken circle that function to increase the gain of the electromagnetic energy at the antennas and thereby increase power transfer efficiency at the chosen frequency for power transfer, in this case, 5.8±0.075 GHz. In embodiments, the traces can be shaped in rectangular or other polygonal shapes.

In embodiments, the FSS 412 can increase efficiency by as much as 10%, 25%, 50%, or more. The substrate used can be standard PCB substrate or other low loss material. In embodiments, the dimensions and layout of the unit cells and antennas can scale with the substrate and operating frequency chosen for the system. For example, for a substrate material having a higher dielectric constant, the dimensions of the unit cells and/or antennas may be decreased. The range of commercial PCBs dielectric constants can span (but is not limited to) a range of about 3 to about 7. The higher the dielectric constant the smaller the unit cells dimensions.

In another example, for higher operating frequencies, the dimensions of the unit cells and/or antennas may be decreased.

Figure 4C:
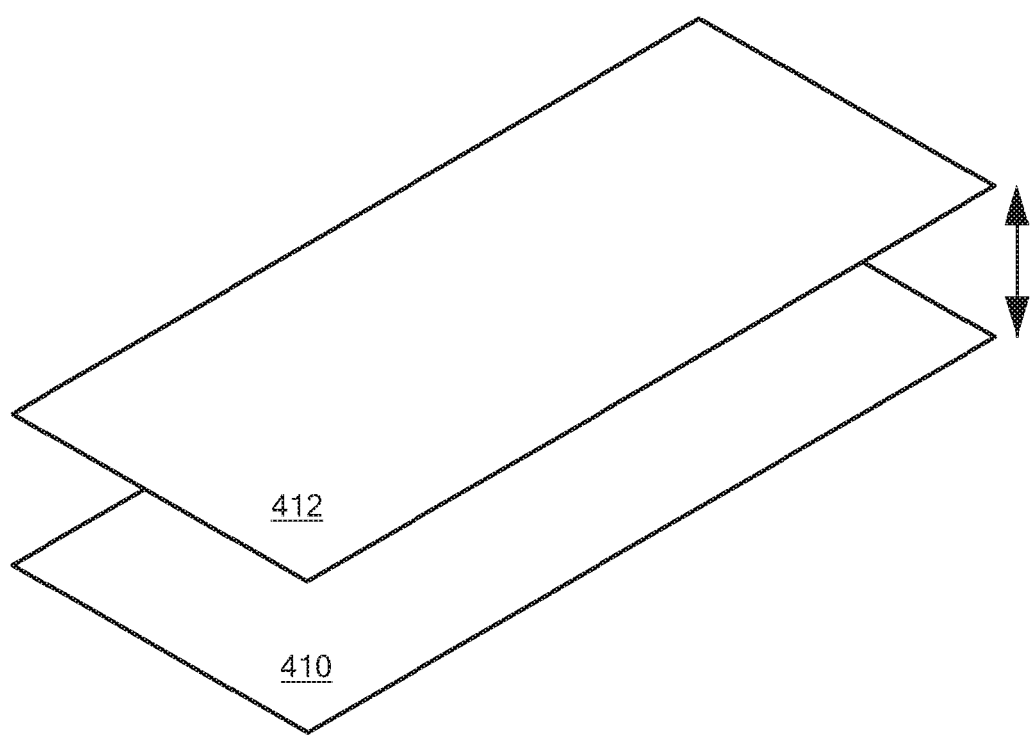
FIG. 4C is a diagram of a receiver system.

FIG. 4C shows a receiver system including the antenna board 402 and the FSS 412. The FSS 412 is positioned over the antenna 402 with a separation 416 of approximately 3-5 mm for operation in the 5.8 GHz range. In embodiments, the separation distance can depend on the point of antenna's maximum efficiency and gain.

A number of embodiments have been described. Nevertheless, it will be understood that various modifications may be made without departing from the spirit and scope of the disclosure.

For example, it has been recognized that many currently explored schemes for radiative wireless power transfer use either 2.4 GHz or 5.8 GHz frequencies. In order to transfer power over substantial distances with an acceptably low divergence angle (so that the efficiency would not be unacceptably low), the sources (transmitters) have to be fairly large. The divergence angle scales as D/λ, where D is the linear size of the source, and λ is the wavelength of the wave used to transmit the power. The size of the source scales as $D^2$, so the penalty for using low wavelength is quite steep. For a frequency of 5.8 GHz, the wavelength λ is about 5 cm.

In contrast, schemes which propose to rely on ultra-sound for wireless power transfer, can have (for a given divergence angle) much smaller sources, simply because their wavelength is much smaller. For example, if $f_{SOUND}$=60 kHz, this corresponds to $\lambda_{SOUND}$~0.5 cm, or 10× smaller than the electromagnetic (EM) wave scheme which uses f=5.8 GHz. So, the transmitters used b ultrasound schemes could in principle be 100× smaller (in area) due to the smaller wavelength. However, the technology for converting energy into ultrasound (and back) is much less mature compared to the EM counterparts.

It has thus also been recognized that the concepts system and techniques described herein may be used at higher frequencies (e.g. frequencies of about 30 GHz or about 60 GHz, or even higher). At 60 GHz, an EM wavelength will be about 0.5 cm, so one may capture many of the theoretical benefits of ultrasound (small wavelength). However, the technology to convert energy into EM waves at 30-60 GHz (and back) is much more mature. One reference on state-of-the-art of such conversion may be found at: http:// repository.kulib.kyoto-u.ac.jp/dspace/bitstream/2433/179775/1/elex.10.20132009.pdf Accordingly, other embodiments are within the scope of the following claims.

What is claimed is:

1. A wireless power transmission system comprising:
a conductive waveguide at least partially filled with a dielectric material, the waveguide extending along a first direction from a first end to a second, opposing end thereof, the waveguide having a bottom face, a top face and a pair of side faces that together form a substantially rectangular cross-section of the waveguide, the top face having a plurality of slots oriented substantially orthogonal to the first direction and distributed between the first and second ends, with adjacent slots spaced from each other by a first distance measured along the first direction, the waveguide comprising
a plurality of barriers interleaved with the plurality of slots, the barriers separated from each other by the first distance, each of the barriers extending between the top and bottom faces and having a barrier cross-section with an area smaller than an area of the waveguide cross-section; and
an input port coupled to the first end of the waveguide, the input port configured to receive an input waveform to be guided by the waveguide;
wherein each of the side faces comprises a plurality of conductive vias distributed from the first end to the opposing end, and
each of the barriers comprises two conductive vias spaced apart from each other by a second distance measured orthogonal to the first direction, and from an adjacent slot by a third distance measured along the first direction.

2. The wireless power transmission system of claim 1 wherein
the waveguide cross-section is configured to cause the waveguide to guide, from the first end to the opposing end, the input waveform having a frequency in a target frequency range, and
a combination of the first distance, the second distance and the third distance is configured to cause an output wave having the frequency of the input waveform to exit the waveguide through the plurality of slots along a propagation direction that forms a first angle, relative the first direction, associated with the frequency of the input waveform.

3. The wireless power transmission system of claim 2 comprising:
a plurality of waveguides arranged along the first direction, and separated from each other by a predetermined separation measured orthogonal to the first direction; and
a plurality of input ports coupled with the first end of each of the respective waveguides, each of the input ports configured to receive a respective input waveform to be guided by the associated waveguide.

4. The wireless power transmission system of claim 3 wherein
the input waveforms applied at the input ports have the same frequency and corresponding phases, and
a combination of the phases and the predetermined separation between the waveguides is configured to cause the output wave to exit the waveguides through the slots along a propagation direction that has a first component that forms the first angle with the first direction and a second component that forms a second angle relative to a direction orthogonal to the first direction.

5. The wireless power transmission system of claim 1 wherein the conductive waveguide comprises a metal or a conductive polymer.

6. The wireless power transmission system of claim 1 wherein the dielectric material comprises low electrical loss material.

7. The wireless power transmission system of claim 1 wherein the dielectric material comprises ceramic, glass, polytetrafluoroethylene, polycarbonate or acrylic.

8. The wireless power transmission system of claim 1 wherein the input port comprises a coaxial cable connector.

9. The wireless power transmission system of claim 8 wherein the input port further comprises impedance matching circuitry.

10. The wireless power transmission system of claim 1 comprising:
a waveform source coupled with the input port to provide the input waveform to the input port.

11. A wireless power transmission system comprising:
a conductive waveguide at least partially filled with a dielectric material, the waveguide extending along a first direction from a first end to a second, opposing end thereof, the waveguide having a bottom face, a top face and a pair of side faces that together form a substantially rectangular cross-section of the waveguide, the top face having a plurality of slots oriented substantially orthogonal to the first direction and distributed between the first and second ends, with adjacent slots spaced from each other by a first distance measured along the first direction, the waveguide comprising
a plurality of barriers interleaved with the plurality of slots, the barriers separated from each other by the first distance, each of the barriers extending between the top and bottom faces and having a barrier cross-section with an area smaller than an area of the waveguide cross-section; and
an input port coupled to the first end of the waveguide, the input port configured to receive an input waveform to be guided by the waveguide;
wherein each of the side faces comprises a conductive plate extending from the first end to the opposing end, and
each of the barriers comprises two conductive plates arranged orthogonally to the respective side faces and separated from each other by a second distance and from an adjacent slot by a third distance.

12. The wireless power transmission system of claim 11 wherein
the waveguide cross-section is configured to cause the waveguide to guide, from the first end to the opposing end, the input waveform having a frequency in a target frequency range, and
a combination of the first distance, the second distance and the third distance is configured to cause an output wave having the frequency of the input waveform to exit the waveguide through the plurality of slots along a propagation direction that forms a first angle, relative the first direction, associated with the frequency of the input waveform.

13. The wireless power transmission system of claim 11 wherein the conductive waveguide comprises a metal or a conductive polymer.

14. The wireless power transmission system of claim 11 wherein the dielectric material comprises low electrical loss material.

15. The wireless power transmission system of claim 11 wherein the dielectric material comprises ceramic, glass, polytetrafluoroethylene, polycarbonate or acrylic.

16. The wireless power transmission system of claim 11 wherein the input port comprises a coaxial cable connector.

17. The wireless power transmission system of claim 16 wherein the input port further comprises impedance matching circuitry.

18. The wireless power transmission system of claim 11 comprising:
a waveform source coupled with the input port to provide the input waveform to the input port.

19. A method for wireless power transmission, the method comprising:
receiving, at an antenna, a first input waveform having a first frequency, wherein the antenna comprises a first 1D-array of resonance cavities that are coupled with their adjacent cavities and through partially transmissive barriers, and have respective slots arranged orthogonally to a first direction that is parallel to the first 1-D array of resonance cavities, wherein the first input waveform is received at a first input port coupled to a first resonance cavity of the first 1D-array of resonance cavities;
guiding the first input waveform through the first 1D-array of coupled resonance cavities;
radiating a first output wave having the first frequency of the first input waveform through the slots along a propagation direction that forms a first angle, relative the first direction, the first angle being associated with the first frequency of the first input waveform;
receiving, at the first input port a second input waveform having a second frequency different from the first frequency;
guiding the second input waveform through the first 1D-array of coupled resonance cavities; and
radiating a second output wave having the second frequency of the second input waveform through the slots along another propagation direction that forms a second angle, relative the first direction, the second angle being different from the first angle and associated with the second frequency of the second input waveform.

20. A method for wireless power transmission, the method comprising:
receiving, at an antenna, a first input waveform having a first frequency, wherein the antenna comprises a first 1D-array of resonance cavities that are coupled with their adjacent cavities and through partially transmissive barriers, and have respective slots arranged orthogonally to a first direction that is parallel to the first 1-D array of resonance cavities, wherein the first input waveform is received at a first input port coupled to a first resonance cavity of the first 1D-array of resonance cavities;
guiding the first input waveform through the first 1D-array of coupled resonance cavities;
radiating a first output wave having the first frequency of the first input waveform through the slots along a propagation direction that forms a first angle, relative the first direction, the first angle being associated with the first frequency of the first input waveform;
receiving, at a plurality of input ports that includes the first input port, first input waveforms having corresponding phases, wherein the input ports are coupled with respective 1D-arrays of coupled resonance cavities that include the first 1D-array of coupled resonance cavities, the 1D-arrays of coupled resonance cavities being parallel to each other and separated from each other by a predetermined separation;
guiding the first input waveforms through the respective 1D-arrays of coupled resonance cavities; and
radiating the first output wave through the slots along another propagation direction that has a first component that forms the first angle relative the first direction, and a second component that forms another angle relative to a direction orthogonal to the first direction.

\* \* \* \* \*